United States Patent
King et al.

(10) Patent No.: US 8,413,024 B2
(45) Date of Patent: Apr. 2, 2013

(54) PERFORMING A CYCLIC REDUNDANCY CHECKSUM OPERATION RESPONSIVE TO A USER-LEVEL INSTRUCTION

(75) Inventors: Steven R. King, Portland, OR (US); Frank Berry, North Plains, OR (US); Michael E. Kounavis, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 13/484,787

(22) Filed: May 31, 2012

(65) Prior Publication Data

US 2012/0240016 A1    Sep. 20, 2012

Related U.S. Application Data

(63) Continuation of application No. 13/097,462, filed on Apr. 29, 2011, now Pat. No. 8,225,184, which is a continuation of application No. 11/316,772, filed on Dec. 23, 2005, now Pat. No. 7,958,436.

(51) Int. Cl.
*H03M 13/00* (2006.01)

(52) U.S. Cl. .......................... 714/781; 714/758; 714/739

(58) Field of Classification Search .................. 714/781, 714/758, 763, 739, 757, 807
See application file for complete search history.

(56) References Cited

U.S. PATENT DOCUMENTS

| | | | |
|---|---|---|---|
| 5,109,498 A | 4/1992 | Kamiya et al. | |
| 5,323,403 A | 6/1994 | Elliott | |
| 5,663,952 A | 9/1997 | Gentry | |
| 5,701,316 A | 12/1997 | Alferness et al. | |
| 5,946,467 A | 8/1999 | Pathakis et al. | |
| 5,974,574 A | 10/1999 | Lennie et al. | |
| 6,029,186 A | 2/2000 | DesJardins et al. | |
| 6,191,614 B1 | 2/2001 | Schultz et al. | |
| 6,237,074 B1 | 5/2001 | Phillips et al. | |
| 6,279,140 B1 | 8/2001 | Slane | |
| 6,631,488 B1 | 10/2003 | Stambaugh et al. | |
| 6,907,466 B2 | 6/2005 | Alexander et al. | |
| 6,957,321 B2 | 10/2005 | Sheaffer | 712/209 |
| 6,964,008 B1 | 11/2005 | Van Meter, III | |
| 7,292,586 B2 | 11/2007 | Dewan et al. | |
| 7,360,142 B1 | 4/2008 | Barash | |
| 7,421,637 B1 | 9/2008 | Martinez et al. | |
| 7,590,930 B2 * | 9/2009 | Kounavis | 714/807 |
| 7,594,124 B2 | 9/2009 | Durham et al. | |
| 7,932,911 B2 * | 4/2011 | Hansen et al. | 345/522 |
| 2004/0037319 A1 | 2/2004 | Pandya | |
| 2004/0113814 A1 | 6/2004 | Lochner | |

(Continued)

FOREIGN PATENT DOCUMENTS

| EP | 0 609 595 | 8/1994 |
|---|---|---|
| TW | 200414042 A | 8/2004 |

(Continued)

OTHER PUBLICATIONS

Taiwanese Patent Office, Office Action mailed Dec. 20, 2010 in Taiwanese patent application No. 095146431.

(Continued)

*Primary Examiner* — Fritz Alphonse

(74) *Attorney, Agent, or Firm* — Trop, Pruner & Hu, P.C.

(57) ABSTRACT

In one embodiment, the present invention includes a method for receiving incoming data in a processor and performing a checksum operation on the incoming data in the processor pursuant to a user-level instruction for the checksum operation. For example, a cyclic redundancy checksum may be computed in the processor itself responsive to the user-level instruction. Other embodiments are described and claimed.

1 Claim, 4 Drawing Sheets

U.S. PATENT DOCUMENTS

| | | | |
|---|---|---|---|
| 2004/0158793 | A1 | 8/2004 | Blightman et al. |
| 2004/0243729 | A1 | 12/2004 | Milliken |
| 2006/0242532 | A1 | 10/2006 | Joglekar |
| 2011/0231636 | A1* | 9/2011 | Olson et al. ................... 712/222 |

FOREIGN PATENT DOCUMENTS

| | | |
|---|---|---|
| TW | 200414045 A | 8/2004 |
| TW | I224729 | 9/2004 |
| TW | I238945 | 9/2005 |

OTHER PUBLICATIONS

Intel Corporation, "Metro Ethernet. End-to-End Single Vendor Connectivity," Apr. 7, 2005, 9 pages.

Lauritzen, Keith, et al., Technology@Intel Magazine, "Intel I/O Acceleration Technology Improves Network Performance, Reliability and Efficiency," Mar. 2005, 11 pages.

Blern, Emily R., et al., Instruction Set Extensions for Cyclic Redundancy Check on a Multithreaded Processor, 7th Workshop on Media and Stream Processors, Dec. 12, 2005, Barcelona Spain.

U.S. Patent and Trademark Office, Restriction Requirement mailed Mar. 10, 2009 with Election filed on Apr. 8, 2009 in U.S. Appl. No. 11/384,527.

U.S. Patent and Trademark Office, Office Action mailed Aug. 20, 2009 with Response filed on Nov. 19, 2009 in U.S. Appl. No. 11/384,527.

U.S. Patent and Trademark Office, Office Action mailed Feb. 17, 2010 with Response filed on May 14, 2010 in U.S. Appl. No. 11/384,527.

Chinese Patent and Trademark Office, Office Action mailed Apr. 7, 2010 in Chinese patent application No. 2007800009844.0.

European Patent Office, Combined Search Report and Search Opinion for EPO Application No. 07758495.1 dated Apr. 29, 2010, 10 pages.

U.S. Patent and Trademark Office, Notice of Allowance issued on Aug. 18, 2010 in U.S. Appl. No. 11/384,527.

U.S. Patent and Trademark Office, Notice of Allowance issued on Dec. 9, 2010 in U.S. Appl. No. 11/384,527.

"The iSCSI CRC23C Digest and the Simultaneous Multiply and Divide Algorithm". Tuikov, Luben and Vicente Cavanna. Jan. 30, 2002.

"Accelerating High-Speed Networking with Intel® I/O Acceleration Technology". Intel® I/O Acceleration Technology White Paper. May 2005.

"A Painless Guide to CRC Error Detection Algorithms". Ross N. Williams. Aug. 19, 2003. http://www.ros.net/crc/download/crc_v3.txt.

U.S. Appl. No. 11/115,656, filed Apr. 26, 2005, entitled "Techniques to Provide Information Validation and Transfer" by Abhijeet Joglekar; Frank L. Berry.

U.S. Appl. No. 11/233,742, filed Sep. 23, 2005, entitled "Techniques to Determine Integrity of Information" by Ronald L. Dammann et.al.

U.S. Appl. No. 11/230,720, filed Sep. 19, 2005, entitled "Techniques to Perform Prefetching of Content in Connection with Integrity Validation Value Determination" by Steven R. King and Frank L. Berry.

U.S. Appl. No. 11/384,527, filed Mar. 20, 2006, entitled "Validating Data Using Processor Instructions" by Steven R. King et al.

Japanese Patent Office, Office Action mailed Jul. 17, 2012 in Japanese application No. 2008-547301.

* cited by examiner

US 8,413,024 B2

PERFORMING A CYCLIC REDUNDANCY CHECKSUM OPERATION RESPONSIVE TO A USER-LEVEL INSTRUCTION

This application is a continuation of U.S. patent application Ser. No. 13/097,462, filed Apr. 29, 2011, which is now U.S. Pat. No. 8,225,184, which is a continuation of U.S. patent application Ser. No. 11/316,772, filed Dec. 23, 2005, which is now U.S. Pat. No. 7,958,436, the content of which is hereby incorporated by reference.

BACKGROUND

Embodiments of the present invention relate to data processing, and more particularly to determining checksums such as cyclic redundancy checks (CRCs).

In data processing systems, it is desirable that data transmitted between a first location and a second location is received accurately, so that additional processing performed on that data at the second location also can be accurate. Further, to enable detection of errors in data transmission, oftentimes a data packet will be transmitted with a checksum attached. For example, a CRC sum can be generated by a transmitting source and appended to data to be transmitted. This checksum, which may be calculated according to one of many different algorithms, can then be compared to a similar checksum generated at the receiving end from the received data. If the two checksums are identical, the transmitted data is correct. If however the generated checksum varies from the transmitted checksum, an error is indicated. Such checksums are used throughout networking technologies to detect transmission errors.

In different applications, different manners of implementing CRC information exists. For example, CRC calculations can be performed in either hardware or software. To implement a CRC calculation in hardware, typically a dedicated hardware engine is provided within a system to perform the CRC calculation. Accordingly, data to be subjected to such a CRC calculation is sent to the hardware engine for calculation of the CRC, which is then appended to the data, e.g., for transmission from the system. Various drawbacks exist to using such an offload engine, including the overhead of sending data to the engine. Furthermore, it is difficult to perform a stateless hardware offload. That is, typically additional state-based overhead data also needs to be transmitted, increasing complexity and slowing the progress of useful work.

Because many systems lack such an offload engine, CRC calculations are often performed in software. To implement CRC calculations in software, typically lookup table schemes are used. However, such software calculations of CRC values are notoriously slow, compute-intensive operations. Further, the memory footprint of the lookup table can be large, impacting performance. Accordingly, these slow calculations can degrade network performance, and further consume processing resources. As an example, it can take between 5 and 15 cycles to perform a CRC calculation per byte of data. As a result, software CRC performance is too low for general use in high-speed networks.

DETAILED DESCRIPTION

In various embodiments, checksum operations may be effected using an instruction set architecture (ISA) extension to compute checksum values. More specifically, a user-level instruction may be provided within an ISA to enable a programmer to directly perform a desired checksum operation such as a CRC operation in a general-purpose processor (e.g., a central processor unit (CPU)) via the instruction. The CRC operation may be a 32-bit CRC operation (i.e., a CRC32 operation generating a 32-bit running reminder, discussed further below), and in different embodiments may, for example, correspond to the CRC used in an Institute of Electrical and Electronics Engineers (IEEE) 802.3 Ethernet protocol (published 2002) or other protocols.

In different implementations, various opcode instructions may be provided to perform CRC computations on different groupings of data. For example, in some embodiments CRC computations may be supported on groups of 8, 16, 32 and 64 bits using different opcodes, although the scope of the present invention is not so limited. In this way, CRC calculations may be rapidly performed in hardware without the need for lookup tables or the like. Furthermore, the computations may be performed using generic, architecturally visible processor registers via integer operations performed according to the different opcodes. As a result, CRCs may be computed in a processor without the need for the overhead and complexity of offload hardware, such as network offload hardware. Accordingly, greater numbers of data transmissions (e.g., in terms of input/outputs (I/Os) per second) can occur. Note that while described primarily herein in connection with CRC operations, embodiments of the present invention may be used to perform other checksum operations.

Figure 1:
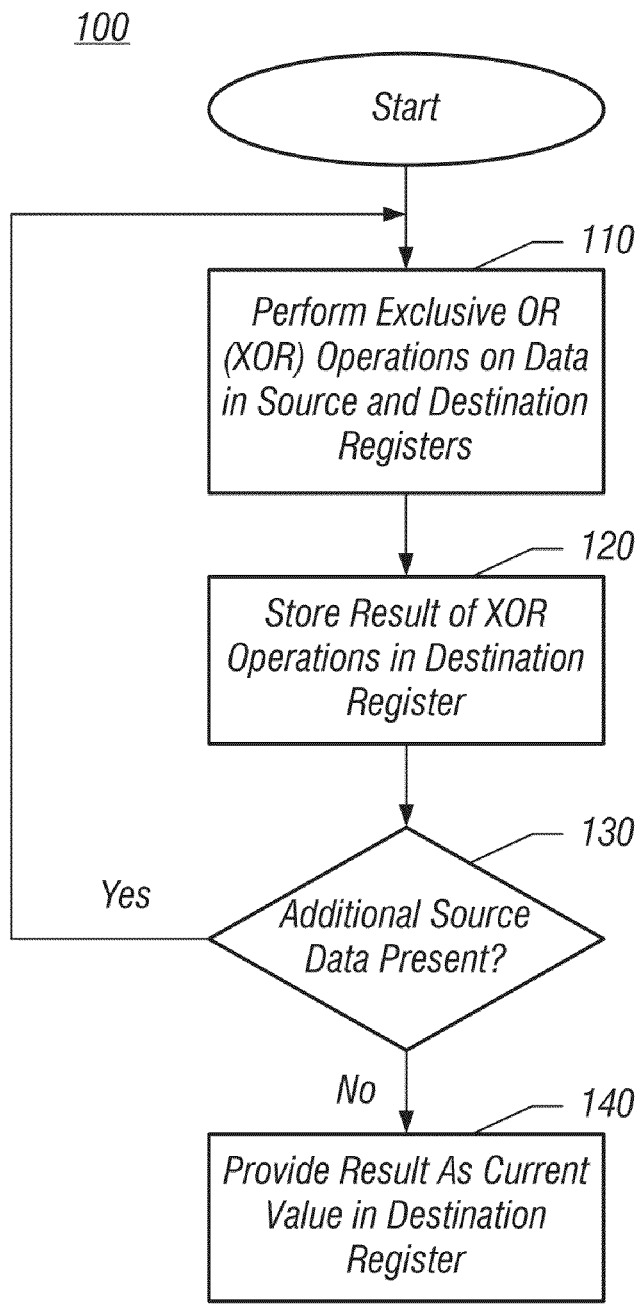
FIG. 1 is a flow diagram of a method in accordance with one embodiment of the present invention.

Referring now to FIG. 1, shown is a flow diagram of a method in accordance with one embodiment of the present invention. Method 100 may be used to obtain a checksum using a user-level instruction implemented on processor hardware, e.g., an execution unit of a CPU. As shown in FIG. 1, method 100 may begin by performing a series of exclusive-OR (XOR) operations on data in source and destination registers (block 110). Note that the XOR operations may correspond to a polynomial arithmetic operation and more particularly to a polynomial division operation. The data in the source register may correspond, e.g., to data present in a processor pipeline that has been received by the processor or is to be transmitted therefrom. As an example, a group of data in a buffer corresponding to a desired group size (e.g., 16 bit, 32 bit or the like) may be provided to the source register, which may be a general-purpose register of the processor. Alternately, the source data may be obtained from a memory, in some embodiments. The destination register may correspond to a storage location for a running remainder obtained from the XOR operations. The destination register also may be a general-purpose register of the processor.

In various embodiments, the XOR operations may be performed in dedicated hardware within a processor pipeline. For example, an execution unit of a processor, e.g., an integer execution unit may be extended with circuitry to implement a series of XOR operations. For example, this circuitry may correspond to a XOR tree to handle polynomial division by a desired polynomial. In various embodiments, a polynomial for use in the XOR operations may be hard-wired into the logic gates of the XOR tree. Furthermore, the XOR tree may be configured to implement desired pre-processing and post-processing via the XOR operations, e.g., bit reflections and the like. Furthermore, the XOR tree logic may include multiple partitions, each configured to handle operations on different data sizes.

Still referring to FIG. 1, next a result, which may correspond to a running remainder obtained from the XOR operations, may be stored in the destination register (block 120). Note that the destination register may, upon initialization of a system, be set to a predetermined value, e.g., all ones, all zeros or another such value. Then during execution of checksum operations, this running remainder is continually updated with the result of the current checksum operation. More specifically, the remainder of the polynomial division implemented by the current checksum operation may be stored in the destination register.

Next, it may be determined whether additional source data is present (diamond 130). For example, in some embodiments a buffer may include data that has been received by a system and is to have a checksum verified. The data may be fed in chunks into the source register to effect the checksum operation. Accordingly, it may be determined in diamond 130 if additional source data is present in this buffer. If so, the next data chunk may be provided to the source register, and control passes back to block 110, discussed above.

If instead at diamond 130 it is determined that no additional source data is present, control passes to block 140. There, the result of the checksum operation may be provided as the current value (e.g., running remainder) that is stored in the destination register (block 140). As discussed above, this checksum value may be used in many different manners. For example, in the case of received data, the computed checksum may be compared to a received checksum to confirm that the data was accurately received. In a transmission situation, the checksum may be appended to data to be transmitted so that the data may be verified on a receiving end. Of course other uses of checksums, such as for hash functions or generation of numbers pursuant to a pseudo random numbering scheme may also occur.

Figure 2:
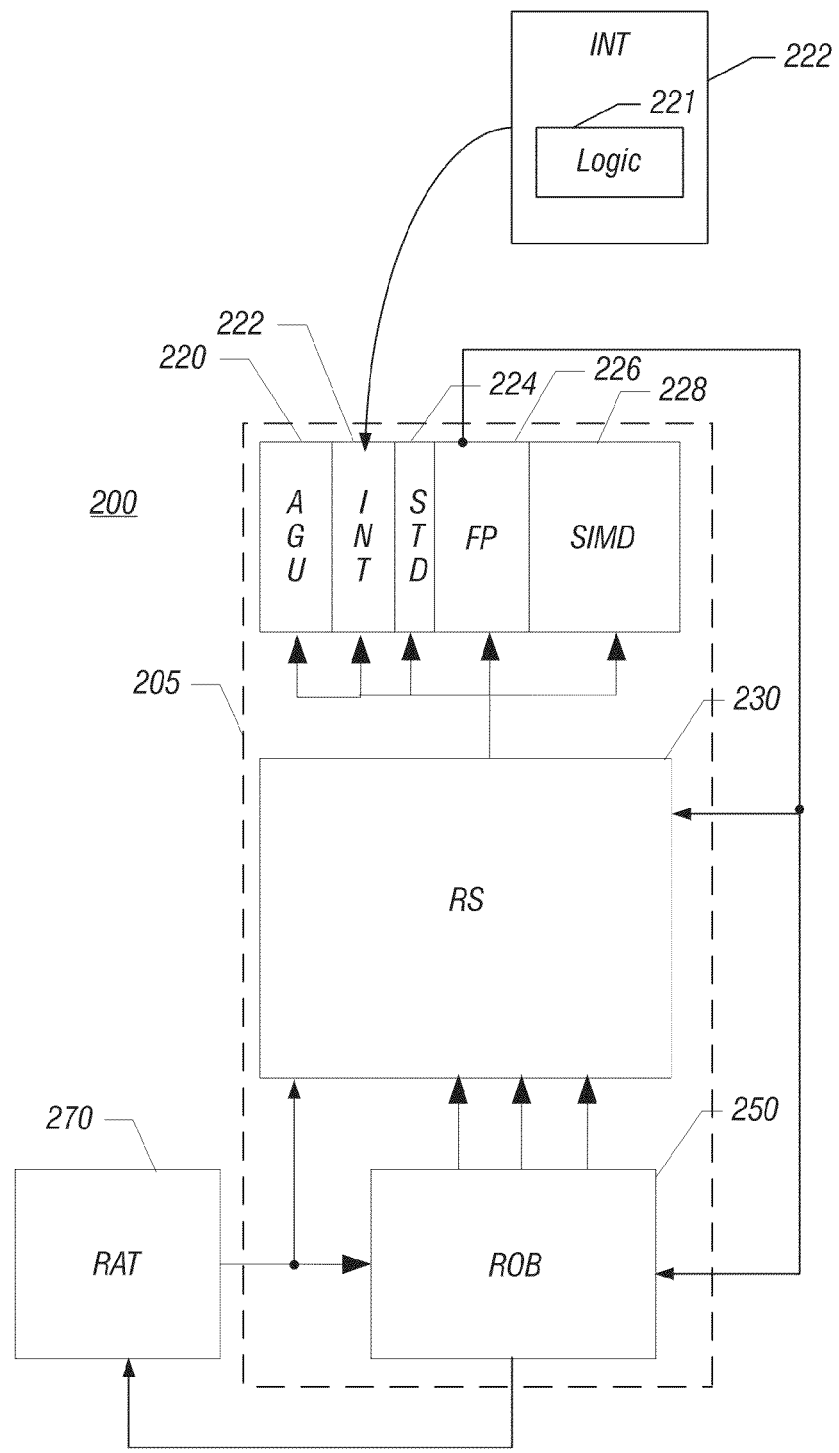
FIG. 2 is a block diagram of a processor in accordance with one embodiment of the present invention.

A processor to implement checksum operations in accordance with an embodiment of the present invention may take many different forms depending on a desired architecture. Referring now to FIG. 2, shown is a block diagram of a processor in accordance with one embodiment of the present invention. As shown in FIG. 2, processor 200 includes a data path 205. Data path 205 may be controlled by front end control stages that may include a register alias table (RAT) 270, which may receive decoded instructions from a front end of the processor (not shown in FIG. 2). RAT 270 may be used to receive microoperations (μops) from the front end and rename the μops for the resources of the data path. In data path 205, the renamed μops may then be provided to a reorder buffer (ROB) 250. ROB 250 may act as a register file to store μops and corresponding source operands until the μop is ready for passing to a reservation station (RS) 230. Similarly, ROB 250 may also store corresponding results of μops that have already executed. These results may be held in ROB 250 until the μops are retired (at which point the ROB entry is freed).

Reservation station 230 may be used to store μops until their corresponding source operands are present and/or until the μop is ready for execution in one of a plurality of execution units of data path 205. Reservation station 230 may include a plurality of dispatch ports to couple instructions and data to selected ones of execution units of data path 205. In some embodiments, multiple dispatch ports may be used in each cycle.

As shown in FIG. 2, the execution units in data path 205 include an address generation unit (AGU) 220, an integer (INT) execution unit 222, a store data (STD) unit 224, a floating point (FP) execution unit 226, and a single instruction multiple data (SIMD) execution unit 228. As shown in FIG. 2, integer execution unit 222 further includes logic 221. Logic 221 may include one or more hardware engines to perform checksum operations in accordance with an embodiment of the present invention. More specifically, logic 221 may include a plurality of exclusive-OR (XOR) logic trees to implement polynomial arithmetic and related data manipulations. In various embodiments, logic 221 may include different hardware engines to implement CRC operations on differently sized data chunks. As an example, a plurality of user-level instructions of an ISA each may define a CRC operation for a particular data size. Logic 221, in some embodiments, may include a corresponding number of separate hardware engines, also referred to herein as XOR trees, to effect these different CRC operations.

While not shown in FIG. 2, additional or different execution units may be present in different embodiments. After execution of a μop in one of the execution units, result data may be passed back to RS 230 and ROB 250 for storage, e.g., until retirement. Thus in one embodiment, both source and data registers for performing a CRC operation may be located in RS 230 or ROB 250. While not shown in FIG. 2, it is to be understood that additional buffers such as a memory order buffer (MOB) and other resources may be present within processor 200.

It is further to be understood that the representation shown in FIG. 2 is intended for ease of discussion and in various embodiments many more stages or differently named stages may exist in a given processor. For example, a write back stage may be coupled to the execution units to receive result data for later delivery to a memory hierarchy. Alternately, one or more other buffers such as store buffers, load buffers and the like may be coupled to RS 230. As one example, one or more retirement buffers may be coupled to RS 230 for storage of μops and associated result data until retirement of the associated instruction.

Figure 3:
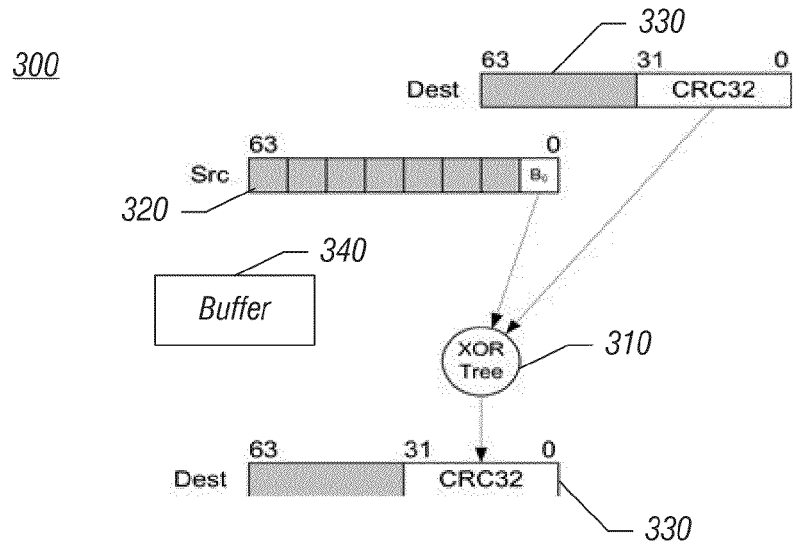
FIG. 3 is a block diagram of a portion of a processor to perform a checksum operation in accordance with an embodiment of the present invention.

Of course, other implementations are possible. Referring now to FIG. 3, shown is a block diagram of a portion of a processor to perform a checksum operation in accordance with an embodiment of the present invention. As shown in FIG. 3, a portion of a processor 300 is shown. More specifically, processor 300 includes an XOR tree 310, a first register 320 and a second register 330, all of which may be part of a processor pipeline. XOR tree 310 may be configured differently in various embodiments. For example, XOR tree 310 may be implemented using a plurality of 3-input XOR gates in a first level, outputs of which are coupled to similar XOR gates of a second level, and so forth. In such an embodiment, each level of the XOR tree may be a third as large as the previous level. Of course, other configurations are possible.

As further shown in FIG. 3, processor 300 includes a buffer 340, which also may be within the processor pipeline (e.g., as a buffer, queue or the like). Alternately, buffer 340 may be a cache memory associated with processor 300. In the embodiment of FIG. 3, first register 320 may correspond to a source register, while second register 330 may correspond to a destination register. In various embodiments, these registers may be general-purpose registers within processor 300. Of course, processor 300 may include many other registers, logic, functional units and the like, and the portion shown in FIG. 3 is for ease of illustration.

As shown in FIG. 3, to perform a checksum in accordance with an embodiment of the present invention, at least a first portion of first register 320 is provided to XOR tree 310, along with a portion of second register 330. In the embodiment shown in FIG. 3, which illustrates an 8-bit CRC accumulation, a single byte of data ($B_0$) is provided to XOR tree 310 from first register 320, while a 4-byte portion of second register 330 is provided to XOR tree 310. This 4-byte portion may correspond to the running remainder of a CRC32 operation. Using this data, XOR tree 310 may perform data manipulations via XOR operations to generate a result that includes a remainder portion. This remainder portion may be the running remainder that is stored back in second register 330, as shown in FIG. 3. In this way, CRC operations can be efficiently performed in minimal cycle time and using minimal processor resources. In the embodiment of FIG. 3, for 8-bit accumulate operations, additional portions of first register 320 may be provided incrementally to XOR tree 310 along with the current contents of second register 330 (i.e., the 32-bit running remainder). Accordingly, to obtain a CRC checksum on 64 bits of data in first register 320, eight iterations of XOR operations in XOR tree 310 may be performed, each using a single byte of data from first register 320, along with the current running remainder in second register 330. If additional data is present in buffer 340 to be validated via a checksum, the additional data may be loaded into first register 320 so that it may then be processed in XOR tree 310.

Figure 4:
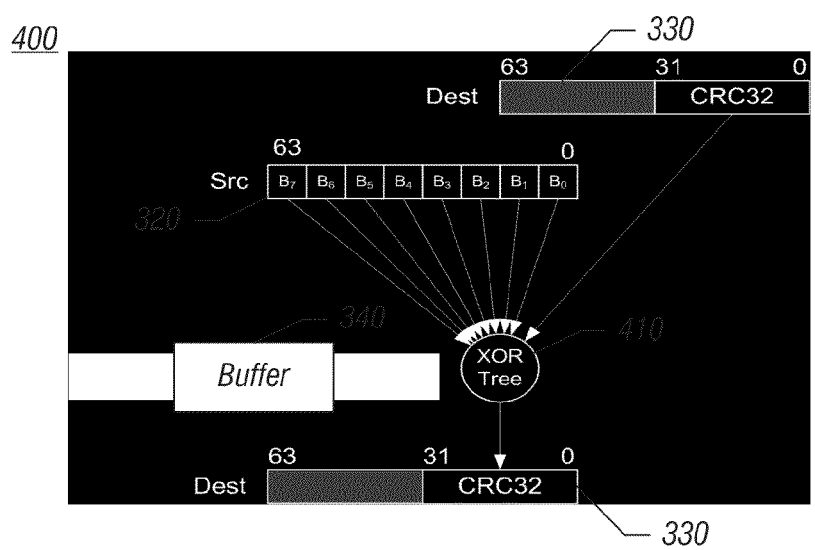
FIG. 4 is a block diagram of another portion of a processor in accordance with an embodiment of the present invention.

Note that different hardware may be present to handle CRC calculations of different bit widths. Accordingly, with reference back to FIG. 2, logic 221 may include different XOR tree structures to handle such CRC calculations. Referring now to FIG. 4, shown is a block diagram of another portion of a processor in accordance with an embodiment of the present invention. As shown in FIG. 4, processor 300 includes a different XOR tree 410 (e.g., in addition to XOR tree 310 of FIG. 3) that is coupled to receive data from first register 320 and second register 330. As further shown in FIG. 4, buffer 340 is present and may be used to provide data for CRC computations. Note that in the embodiment of FIG. 4, XOR tree 410 is configured to handle a 64-bit CRC accumulation. Accordingly, the entire contents of first register 320 (i.e., bytes $B_0$-$B_7$) may be coupled at one time to XOR tree 410 for manipulation in XOR operations with data in second register 330. The result data, the desired portion of which corresponds to a running remainder, is stored back in second register 330. While described with these particular implementations in FIGS. 3 and 4, it is to be understood that the scope of the present invention is not so limited, and in other embodiments different hardware configurations for performing CRC operations may be present.

Referring now to Table 1 below, shown is a listing of example instructions of an instruction set architecture (ISA) to support CRC operations in accordance with various embodiments of the present invention. As shown in Table 1, each instruction, which may be referenced by an opcode, is used to perform a CRC32 operation using a source register and a destination register. As shown, differs flavors are possible, with each instruction to perform the CRC operation on a given size of destination operand and source operand. Thus with reference to the first line of Table 1, this instruction is used to perform a CRC32 operation on an 8-bit source operand and a 32-bit destination operand. Similarly, the second line of Table 1 is used to perform a CRC32 operation on a 16-bit source operand and a 32-bit destination operand. In similar fashion, the third line of Table 1 shows an instruction to perform a CRC32 operation on a 32-bit source operand and a 32-bit destination operand.

Because these first three instructions are performed with maximum data chunks of 32 bits, note that the instructions are valid in both a 64-bit mode of operation as well as a legacy (i.e., 32-bit) mode of operation. In contrast, the fourth and fifth lines of Table 1 denote CRC operations to be performed on 8-bit and 64-bit source operands, respectively with a 64-bit destination operand. Thus these final two instructions may be performed only in a 64-bit mode of operation.

TABLE 1

| Opcode | Instruction | Description |
| --- | --- | --- |
| Code 2 | CRC32 r32, r/m8 | Accumulate CRC32 on r/m8 |
| Code 1 | CRC32 r32, r/m16 | Accumulate CRC32 on r/m16 |
| Code 1 | CRC32 r32, r/m32 | Accumulate CRC32 on r/m32 |
| Code 2 | CRC32 r64, r/m8 | Accumulate CRC32 on r/m8 |
| Code 1 | CRC32 r64, r/m64 | Accumulate CRC32 on r/m64 |

In various embodiments, these user-level instructions may be used by a programmer, e.g., as intrinsics to implement a CRC operation in accordance with the flow diagram of FIG. 1, for example.

In general, a user-level CRC instruction may be implemented in the following manner. Starting with an initial value in a first operand (i.e., a destination operand), a CRC32 value for a second operand (i.e., a source operand) may be accumulated and the result stored back in the destination operand. In different implementations, the source operand can be a register or a memory location. The destination operand may be a 32 or 64-bit register. If the destination is a 64-bit register, then the 32-bit result may be stored in the least significant double word and 00000000H stored in the most significant double word of the register.

Note that the initial value supplied in the destination operand may be a double word integer stored in a 32-bit register, or the least significant double word of a 64-bit register. To incrementally accumulate a CRC32 value, software retains the result of the previous CRC operation in the destination operand, and then executes the CRC operation again with new input data in the source operand. Accordingly, each instruction takes a running CRC value in the first operand and updates the CRC value based on the second operand. In this manner, a CRC can be generated over any desired amount of data by performing the operation in a loop, until all desired data is subjected to the CRC operation.

In some implementations, data contained in the source operand is processed in reflected bit order. This means that the most significant bit of the source operand is treated as the least significant bit of the quotient, and so on, for all the bits of the source operand. Likewise, the result of the CRC operation can be stored in the destination register in reflected bit order. This means that the most significant bit of the resulting CRC (i.e., bit 31) is stored in the least significant bit of the destination register (bit 0), and so on, for all the bits of the CRC.

While different manners of implementing these user-level instructions can be effected, Tables 2-6 below show example pseudocode representations of a hardware implementation for each of the user-level instructions of Table 1.

TABLE 2

CRC32 instruction for 64-bit source operand and
64-bit destination operand:

TEMP1[63-0] ← BIT_REFLECT64 (SRC[63-0])
TEMP2[31-0] ← BIT_REFLECT32 (DEST[31-0])
TEMP3[95-0] ← TEMP1[63-0] << 32
TEMP4[95-0] ← TEMP2[31-0] << 64
TEMP5[95-0] ← TEMP3[95-0] XOR TEMP4[95-0]
TEMP6[31-0] ← TEMP5[95-0] MOD2 11EDC6F41H
DEST[31-0] ← BIT_REFLECT (TEMP6[31-0])
DEST[63-32] ← 00000000H

TABLE 3

CRC32 instruction for 32-bit source operand and
32-bit destination operand:

TEMP1[31-0] ← BIT_REFLECT32 (SRC[31-0])
TEMP2[31-0] ← BIT_REFLECT32 (DEST[31-0])
TEMP3[63-0] ← TEMP1[31-0] << 32
TEMP4[63-0] ← TEMP2[31-0] << 32
TEMP5[63-0] ← TEMP3[63-0] XOR TEMP4[63-0]
TEMP6[31-0] ← TEMP5[63-0] MOD2 11EDC6F41H
DEST[31-0] ← BIT_REFLECT (TEMP6[31-0])

TABLE 4

CRC32 instruction for 16-bit source operand and
32-bit destination operand::

TEMP1[15-0] ← BIT_REFLECT16 (SRC[15-0])
TEMP2[31-0] ← BIT_REFLECT32 (DEST[31-0])
TEMP3[47-0] ← TEMP1[15-0] << 32
TEMP4[47-0] ← TEMP2[31-0] << 16
TEMP5[47-0] ← TEMP3[47-0] XOR TEMP4[47-0]
TEMP6[31-0] ← TEMP5[47-0] MOD2 11EDC6F41H
DEST[31-0] ← BIT_REFLECT (TEMP6[31-0])

TABLE 5

CRC32 instruction for 8-bit source operand and
64-bit destination operand:

TEMP1[7-0] ← BIT_REFLECT8(SRC[7-0])
TEMP2[31-0] ← BIT_REFLECT32 (DEST[31-0])
TEMP3[39-0] ← TEMP1[7-0] << 32
TEMP4[39-0] ← TEMP2[31-0] << 8
TEMP5[39-0] ← TEMP3[39-0] XOR TEMP4[39-0]
TEMP6[31-0] ← TEMP5[39-0] MOD2 11EDC6F41H
DEST[31-0] ← BIT_REFLECT (TEMP6[31-0])
DEST[63-32] ← 00000000H

TABLE 6

CRC32 instruction for 8-bit source operand and
32-bit destination operand:

TEMP1[7-0] ← BIT_REFLECT8(SRC[7-0])
TEMP2[31-0] ← BIT_REFLECT32 (DEST[31-0])
TEMP3[39-0] ← TEMP1[7-0] << 32
TEMP4[39-0] ← TEMP2[31-0] << 8
TEMP5[39-0] ← TEMP3[39-0] XOR TEMP4[39-0]
TEMP6[31-0] ← TEMP5[39-0] MOD2 11EDC6F41H
DEST[31-0] ← BIT_REFLECT (TEMP6[31-0])

Note that the general structure of these pseudocode snippets are the same. First, data in a source register is bit reflected (i.e., its bits are placed into a temporary register in reverse bit order). The destination register is similarly bit reflected. Next, shift operations, more particularly shift left operations, may be effected on both of the bit-reflected source and data operands. The resulting values may then be subjected to an XOR operation. This operation may correspond to a polynomial division by a selected polynomial value. While this value may take many different forms in different embodiments, in particular implementations for performing CRC32 operations, the polynomial may correspond to 11EDC6F41H, although the scope of the present invention is not so limited. The remainder of this polynomial division (i.e., the remainder from the polynomial division modulus 2) is stored back into the low order bits of the destination operand in a bit-reflected order (e.g., bits 0-31 of either a 32-bit or 64-bit register). In the instance of a 64-bit register, the most significant bits (MSBs) may be loaded with zeros. While set forth with this particular implementation with respect to Tables 2-6, it is to be understood that other manners of providing a user-level CRC instruction may be performed.

By performing CRC operations in a processor pipeline itself according to a user-level instruction, there is no need to send data to an offload engine. Similarly, the operation can be performed without providing state, reducing overhead. In this way, as implemented in a three-cycle path a CRC operation may be performed at less than approximately 0.4 cycles per byte. Accordingly, performance may be improved using user-level instructions along with dedicated hardware in a processor pipeline. Furthermore, three-cycle latency may be realized with minimum real estate consumption and power consumption. Embodiments of the present invention may be used to enable processing of various storage protocols, for example, an Internet Small Computer System Interface (iSCSI) protocol at rates greater than 10 gigabits per second. Embodiments of the present invention further allow the use of data present in a processor or closely coupled thereto, reducing the need for on-cache data. In this way, data in a processor buffer may be fed to an XOR tree to enable rapid, on-the-fly CRC calculations.

Figure 5:
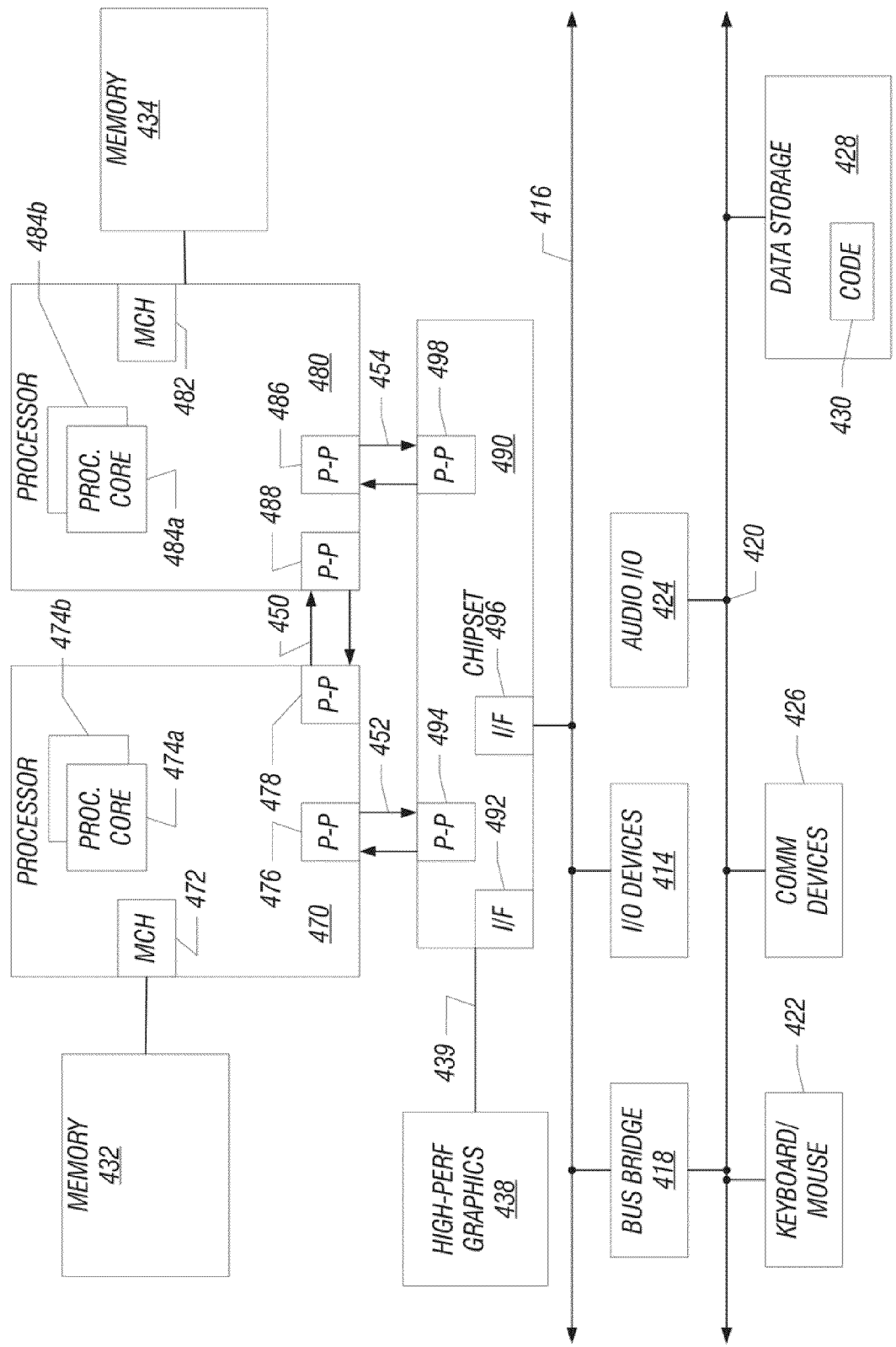
FIG. 5 is a block diagram of a system in accordance with an embodiment of the present invention.

Embodiments may be implemented in many different system types. Referring now to FIG. 5, shown is a block diagram of a multiprocessor system in accordance with an embodiment of the present invention. As shown in FIG. 5, the multiprocessor system is a point-to-point interconnect system, and includes a first processor 470 and a second processor 480 coupled via a point-to-point interconnect 450. As shown in FIG. 5, each of processors 470 and 480 may be multicore processors, including first and second processor cores (i.e., processor cores 474a and 474b and processor cores 484a and 484b). While not shown for ease of illustration, first processor 470 and second processor 480 (and more specifically the cores therein) may include XOR tree logic within their execution units to execute user-level CRC instructions in accordance with an embodiment of the present invention. First processor 470 further includes a memory controller hub (MCH) 472 and point-to-point (P-P) interfaces 476 and 478. Similarly, second processor 480 includes a MCH 482 and P-P interfaces 486 and 488. As shown in FIG. 5, MCH's 472 and 482 couple the processors to respective memories, namely a memory 432 and a memory 434, which may be portions of main memory locally attached to the respective processors.

First processor 470 and second processor 480 may be coupled to a chipset 490 via P-P interconnects 452 and 454, respectively. As shown in FIG. 5, chipset 490 includes P-P interfaces 494 and 498. Furthermore, chipset 490 includes an interface 492 to couple chipset 490 with a high performance graphics engine 438. In one embodiment, an Advanced Graphics Port (AGP) bus 439 may be used to couple graphics engine 438 to chipset 490. AGP bus 439 may conform to the Accelerated Graphics Port Interface Specification, Revision 2.0, published May 4, 1998, by Intel Corporation, Santa Clara, Calif. Alternately, a point-to-point interconnect 439 may couple these components.

In turn, chipset 490 may be coupled to a first bus 416 via an interface 496. In one embodiment, first bus 416 may be a Peripheral Component Interconnect (PCI) bus, as defined by the PCI Local Bus Specification, Production Version, Revision 2.1, dated June 1995 or a bus such as the PCI Express bus or another third generation input/output (I/O) interconnect bus, although the scope of the present invention is not so limited.

As shown in FIG. 5, various I/O devices 414 may be coupled to first bus 416, along with a bus bridge 418 which couples first bus 416 to a second bus 420. In one embodiment, second bus 420 may be a low pin count (LPC) bus. Various devices may be coupled to second bus 420 including, for example, a keyboard/mouse 422, communication devices 426 and a data storage unit 428 which may include code 430, in one embodiment. Further, an audio I/O 424 may be coupled to second bus 420. Note that other architectures are possible. For example, instead of the point-to-point architecture of FIG. 5, a system may implement a multi-drop bus or another such architecture.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
   logic to perform a user-level instruction, wherein the logic is to perform at least one exclusive-OR operation on data of one of a variable number of data sizes responsive to the user-level instruction.

* * * * *